United States Patent
Tiziani et al.

(10) Patent No.: US 6,838,755 B2
(45) Date of Patent: Jan. 4, 2005

(54) LEADFRAME FOR INTEGRATED CIRCUIT CHIPS HAVING LOW RESISTANCE CONNECTIONS

(75) Inventors: Roberto Tiziani, Nerviano (IT); Carlo Cognetti, Milan (IT); Andrea Cigada, Brugherio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 384 days.

(21) Appl. No.: 09/862,214

(22) Filed: May 21, 2001

(65) Prior Publication Data

US 2002/0043701 A1 Apr. 18, 2002

(30) Foreign Application Priority Data

May 23, 2000 (IT) ..................... MI2000A1145

(51) Int. Cl.[7] ........................ H01L 23/495; H01L 21/48
(52) U.S. Cl. ................. 257/676; 257/690; 257/692; 257/693; 257/773; 257/784; 438/123; 361/723; 361/813
(58) Field of Search ................ 257/666, 669, 257/670, 672, 674, 676, 678, 690, 691, 692, 693, 734, 773, 775, 784, 668; 361/600, 679, 688, 704, 723, 813; 438/106, 110, 111, 121, 123

(56) References Cited

U.S. PATENT DOCUMENTS

| | | | | |
|---|---|---|---|---|
| 4,534,105 A | * | 8/1985 | Reusch | 257/676 |
| 5,168,368 A | * | 12/1992 | Gow, III et al. | 257/666 |
| 5,420,758 A | * | 5/1995 | Liang | 361/813 |
| 5,753,977 A | * | 5/1998 | Kusaka et al. | 257/787 |
| 5,757,067 A | * | 5/1998 | Inaba | 257/666 |
| 5,898,213 A | * | 4/1999 | Torres et al. | 257/666 |
| 5,955,778 A | * | 9/1999 | Shingai | 257/666 |
| 6,144,089 A | * | 11/2000 | Corisis | 257/691 |
| 6,168,975 B1 | * | 1/2001 | Zhang et al. | 438/111 |
| 6,396,132 B1 | * | 5/2002 | Bozzini | 257/672 |

FOREIGN PATENT DOCUMENTS

| | | | |
|---|---|---|---|
| JP | 1-312866 | * | 12/1989 |
| JP | 4-51553 | * | 2/1992 |
| JP | 4-269856 | * | 9/1992 |
| JP | 11-330132 | * | 11/1999 |

* cited by examiner

*Primary Examiner*—David L. Talbott
*Assistant Examiner*—Alonzo Chambliss
(74) *Attorney, Agent, or Firm*—Jenkens & Gilchrist, P.C.

(57) ABSTRACT

A leadframe for semiconductor devices, including a region which is adapted to support a semiconductor device and a plurality of leads which are arranged so as to be directed toward the region, for mutual connection, by connecting wires connecting the leads and the semiconductor device. The leads include leads having at least two different lengths for the connection of connecting wires having different diameters.

16 Claims, 1 Drawing Sheet

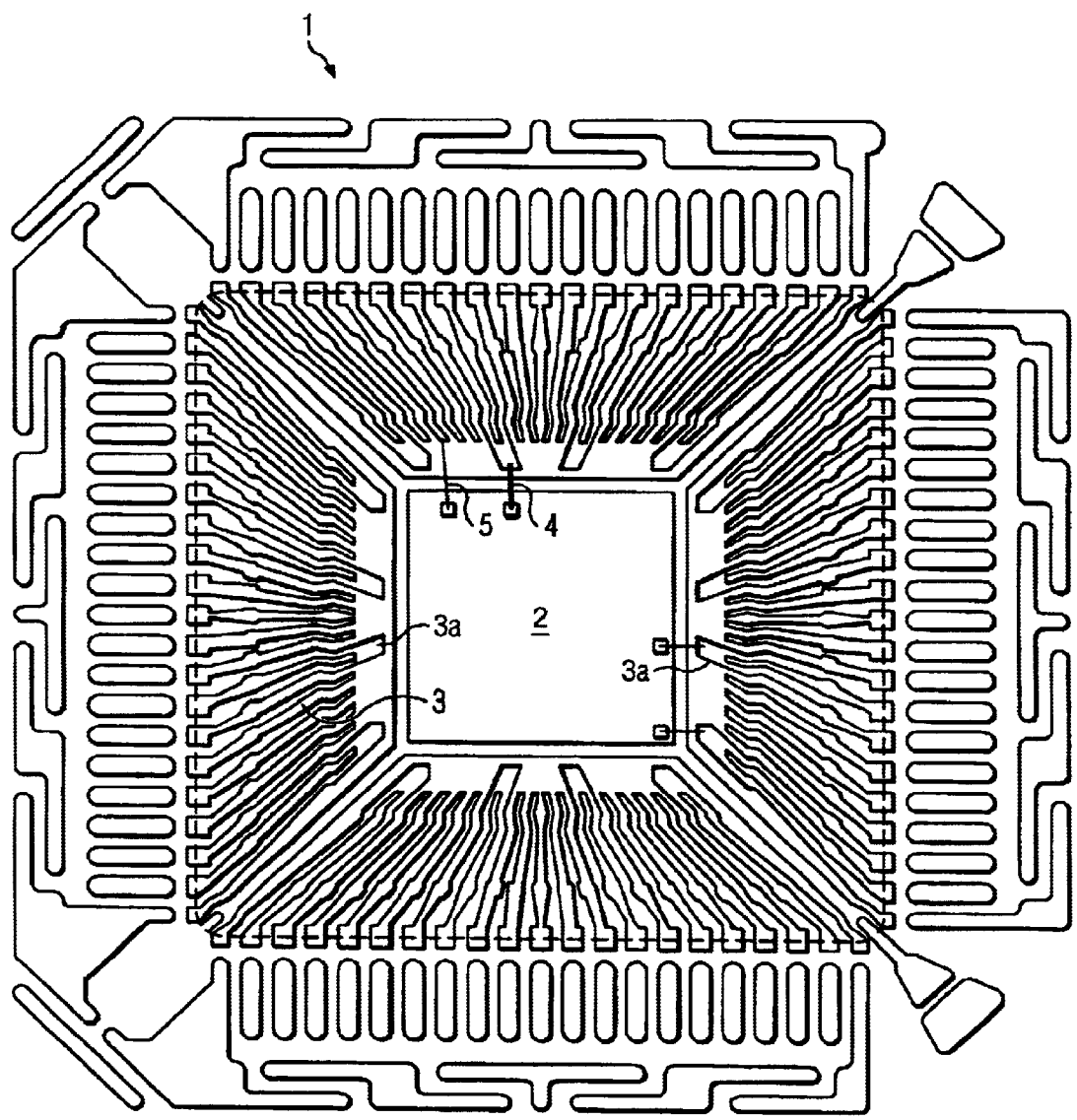

LEADFRAME FOR INTEGRATED CIRCUIT CHIPS HAVING LOW RESISTANCE CONNECTIONS

BACKGROUND OF THE INVENTION

1. Technical Field of the Invention

The present invention relates to a leadframe for chips, having low-resistance connections.

2. Description of the Related Art

It is known that the manufacture of integrated-circuit devices provides for a metallic supporting frame (leadframe) on which the semiconductor chip is placed and appropriately connected to the leadframe by means of wires.

The current trend is to increasingly miniaturize chips, which accordingly have high efficiency as regards their electrical resistance.

Chip leadframes, however, have leads whose spacing and dimensions are limited by the mechanical stamping capabilities of the devices meant to manufacture the leadframes.

Consequently, the ever-smaller chips are connected on chip supporting pads having correspondingly reduced dimensions, but the leads of the leadframes are distant from the chip.

Consequently, the electrical resistance of the chip is determined not only by the electrical resistance of the silicon chip itself but also by the electrical resistance of the wires that connect the silicon chip to the leadframe.

Accordingly, the greater the distance between the chip and the leads, the greater the electrical resistance offered by the connecting wires.

Moreover, in the case of an application with leadframes which require wires having two diameters, a larger one for the power section and a smaller one for the signal section, for the wires that must withstand high power levels (i.e., the larger-diameter ones) it is preferable to reduce the resistance as much as possible, but this does not appear to be possible with currently known leadframes.

Moreover, in the case of a high-density leadframe in which the end of the leads is relatively distant from the central area where the chip will be arranged, a simple increase in the length of the leads toward the chip would lead to a situation in which the dimensions of the end of the leads that is directed toward the chip are insufficient to accommodate the larger-diameter wire.

The case of a leadframe provided with a chip having connecting wires with a length of approximately 3 mm and a diameter of 1.2 mils is described by way of example.

A gold wire having a diameter of 1.2 mils has an electrical resistance of approximately 30 mohm/mm and therefore the electrical resistance of the connecting wire, which is 3 mm long, is 90 mohm. This resistance has to be counted twice (for the input and for the output).

Accordingly, the total electrical resistance may be determined to be

90 *mohm*+20 *mohm*+90 *mohm*=200 *mohm*.

The electrical resistance is too high for some applications, especially owing to the fact that the total resistance of the device is determined not only by the above-cited electrical resistance but also by the resistance of the chip itself.

SUMMARY OF THE INVENTION

Embodiments of the present invention provide a leadframe having an electrical resistance which is minimized with respect to conventional leadframes.

Embodiments of the present invention further provide a leadframe for semiconductor chips which has a minimized electrical resistance and is particularly suitable for use with chips which require connections to the leadframe with wires having different diameters. In this case, the length of the larger-diameter wires for connection between the semiconductor chip and the leadframe is minimized.

In particular, an exemplary embodiment of the present invention includes a leadframe for semiconductor devices, having a region which is adapted to support a semiconductor device and a plurality of leads which are arranged so as to be directed toward the region, for mutual connection, by connecting wires between the leads and the semiconductor device. The leads have at least two different lengths for connecting to the semiconductor device with wires having different diameters. Leads with longer lengths have end portions positioned closer to the semiconductor device than end portions of leads having shorter lengths.

BRIEF DESCRIPTION OF THE DRAWING

Further characteristics and advantages of the invention will become better apparent from the following detailed description of a preferred but not exclusive embodiment of the leadframe according to the invention, illustrated only by way of non-limitative example in the accompanying drawing, wherein the only FIGURE is a plan view of the leadframe according to the present invention, with the semiconductor chip applied thereto in a central position.

DESCRIPTION OF THE PREFERRED EMBODIMENTS

With reference to the only FIGURE cited above, the leadframe for semiconductor chip, generally designated by the reference numeral 1, is constituted by a stamped frame made of metallic material which supports, at a central region, a semiconductor chip 2 which is to be connected to the leadframe by means of connecting wires, such as bond wires, which can have different diameters according to the type of connection, power level or input/output signal.

The leadframe 1 is provided with a plurality of leads 3 which are arranged so as to substantially surround the semiconductor chip, and a connection between the semiconductor chip 2 and the leadframe 1 corresponds to each lead. As can be seen in the drawing, leads 3 are disposed along each side of semiconductor chip 2.

Leadframe 1 is provided with leads 3 having at least two different lengths. In the FIGURE, the reference numeral 3*a* designates a lead that is longer than the leads designated by the reference numeral 3.

In this case, as clearly noticeable, each lead 3*a* is arranged to have end portions positioned substantially closer to the semiconductor chip 2 than the leads 3, and this provides wire connections between the leads 3*a* and the semiconductor chip 2 that are shorter than the wire connections connected to leads 3, which are more distant from the semiconductor chip 2. As shown in the FIGURE, leads 3*a* are disposed along each side of semiconductor chip 2. It is understood, however, that leads 3*a* may be disposed along three or few sides of semiconductor chip 2.

The different length of the leads 3*a* and 3 solves the problem of reducing the wire resistance, which increases as the length of the connecting wire increases.

For leadframes with wires that must carry high power levels and accordingly have a larger diameter than the wires that carry lower power levels, it is convenient to reduce as much as possible the resistance of the wire and therefore shorten its length. For this purpose, the larger-diameter wires are connected to the leads 3a, which are closer to the semiconductor chip than the leads 3. This is shown in the FIGURE, with larger diameter wire 4 being connected to a lead 3a and smaller diameter wire 5 being connected to a lead 3.

In the case of connecting wires having different diameters, the larger-diameter wires cannot be connected to conventional leads 3, whose dimensions would be insufficient to accommodate such wires.

Accordingly, in the case of structures having a high lead density, the connection of wires 4 having a large diameter is not feasible. For this purpose, the invention merges together at least two leads, so as to increase their surface and thus allow the connection of connecting wires having a large diameter.

The leads that are merged together are adjacent leads which form the leads 3a as shown in the FIGURE. In this case, the leads 3a that are longer than the remaining leads are obtained, in the case of a high lead density of leadframe 1, by merging at least two adjacent leads.

In this manner, the joining of the leads further reduces the electrical resistance of the chip, which is the sum of the intrinsic resistance of the chip plus the resistance of the connecting wires.

In practice it has been observed that the leadframe 1 according to the invention substantially reduces the resistance of the chip with shorter electrical wire connections and with the possibility to connect connecting wires 4 having a larger diameter to leads which are merged together so as to be able to accommodate larger-diameter wires on their enlarged surface.

The electrical resistance obtained with a connecting wire length of 1.6 mm obtainable with the leads 3a shown in the FIGURE is described by way of example only. The electrical resistance of a wire which is 3 mils thick is approximately 5 mohm per mm and therefore the total electrical resistance is, considering the electrical resistance of a semiconductor chip approximately equal to 20 mohm with 1 $mm^2$ of area, approximately 36 mohm (8 mohm+20 mohm+8 mohm). If the 3-mil-thick wire is doubled, the total electrical resistance can be seen to be 28 mohm (4 mohm+20 mohm+4 mohm).

The leadframe thus conceived is susceptible of numerous modifications and variations, all of which are within the scope of the inventive concept; all the details may further be replaced with technically equivalent elements.

In practice, the materials employed, so long as they are compatible with the specific use, as well as the dimensions, may be any according to requirements and to the state of the art.

What is claimed is:

1. A leadframe for semiconductor devices, comprising a region which is adapted to support a semiconductor device and a plurality of leads which are arranged so as to be directed toward said region, for connection to the semiconductor device by connecting wires, wherein said leads include leads having at least two different lengths, leads having longer lengths providing for shorter wire connections to the semiconductor device, at least one of said leads having longer lengths comprises at least two leads merged together in an area between said region which is adapted to support a semiconductor device and leads having shorter lengths relative to said leads having longer lengths, an end portion of said at least one of said leads having longer lengths being located in the area and being adapted to support a bond wire connection.

2. The leadframe according to claim 1, wherein leads of said plurality of leads having longer lengths each comprises at least two adjacent leads connected together.

3. The leadframe according to claim 1, wherein said leads having longer lengths have end portions that are closer to said region for supporting said semiconductor device, relative to end portions of said leads having shorter lengths.

4. The leadframe according to claim 1, wherein said plurality of leads face each side of said semiconductor device disposed on the region.

5. A packaged semiconductor device, comprising a leadframe and a semiconductor device disposed over a central region thereof, said leadframe being provided with a plurality of leads which have at least two different lengths, longer of said leads having end portions that are disposed closer to the semiconductor device than end portions of shorter leads, bond wires connecting each of said longer leads to the semiconductor device having a first diameter, and bond wires connecting said shorter leads to the semiconductor device having a second diameter smaller than the first diameter.

6. The packaged semiconductor device of claim 5, wherein each of said longer leads comprises at least two adjacent shorter leads connected together, each said at least two adjacent shorter leads being merged together and having an end portion in an area between said central region and said shorter leads, at least one bond wire connecting at least one of said longer leads to said semiconductor device being connected to said end portion.

7. The packaged semiconductor device of claim 5, wherein said longer leads axe connected by the bond wires to locations along each side of the semiconductor device.

8. The packaged semiconductor device of claim 5, wherein said longer leads are substantially evenly disposed around the semiconductor device.

9. A leadframe for a semiconductor chip, comprising:
a central region for supporting a semiconductor chip thereon; and
a plurality of leads arranged around the central region, leads having longer lengths including end portions disposed at a distance from the central region that is less than the distance from the central region to end portions of leads having shorter lengths, at least one of the leads having longer lengths comprising at least two adjacent leads merged together and having an end portion between the central region and end portions of leads having shorter lengths, the end portion of the at least one of the leads having longer lengths being adapted to support a bond wire connection.

10. The leadframe of claim 9, wherein each of tile leads having longer lengths comprise two adjacent leads connected together.

11. The leadframe of claim 9, wherein the leads having longer lengths are disposed adjacent each side of the semiconductor chip.

12. A semiconductor chip assembly, comprising:
a semiconductor chip;
a leadframe having a region on which the semiconductor chip is disposed and a plurality of leads, longer leads having end portions disposed closer to the semiconductor chip than end portions of shorter leads; and
a plurality of bond wires connecting a plurality of leads to the semiconductor chip, bond wires connecting the longer leads to the semiconductor chip have a diameter that is greater than the diameter of bond wires connecting shorter leads to the semiconductor chip.

13. The semiconductor chip assembly of claim 12, wherein the longer leads comprise adjacent leads connected together and having an end portion extending inwardly towards the semiconductor chip between the semiconductor chip and end portions of the shorter leads.

14. The semiconductor chip assembly of claim 12, wherein the longer lead; are disposed along each side of the semiconductor chip.

15. A semiconductor chip assembly comprising:
   a semiconductor chip,
   a leadframe having a region on which the semiconductor chip is disposed and a plurality of leads, first leads having end portions disposed closer to the semiconductor chip than and portions of second leads; and
   a plurality of bond wires, each bond wire connecting a lead to the semiconductor chip, wherein at least one of the first leads comprise adjacent leads connected together and having an end portion extending inwardly towards the semiconductor chip between the region on which the semiconductor chip is disposed and end portions of some of the second leads.

16. The semiconductor chip assembly of claim 15, wherein the bond wires connected to the first leads has a larger cross-sectional area than a cross-sectional area of at least one bond wire connected to a second lead.

* * * * *

UNITED STATES PATENT AND TRADEMARK OFFICE
CERTIFICATE OF CORRECTION

PATENT NO.   : 6,838,755 B2
DATED        : January 4, 2005
INVENTOR(S)  : Roberto Tiziani It is certified that error appears in the above-identified patent and that said Letters Patent is hereby corrected as shown below:

Column 4,
Line 31, replace "leads axe" with -- leads are --.
Line 50, replace "each of tile leads" with -- each of the leads --.
Line 63, replace "connecting a plurality" with -- connecting the plurality --.

Column 5,
Line 7, replace "lead; are" with -- leads are --.
Line 9, replace "assembly comprising:" with -- assembly, comprising: --.
Line 10, replace "chip," with -- chip; --.
Line 14, replace "than and portions" with -- than end portions --.

Signed and Sealed this

Twenty-fifth Day of October, 2005

JON W. DUDAS
*Director of the United States Patent and Trademark Office*